United States Patent
Cheng (10) Patent No.: US 10,606,114 B2
(45) Date of Patent: Mar. 31, 2020

(54) LIQUID CRYSTAL DISPLAY PANEL AND DISPLAY DEVICE

(71) Applicant: BOE Technology Group Co., Ltd., Beijing (CN)

(72) Inventor: Hongfei Cheng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 22 days.

(21) Appl. No.: 15/539,798

(22) PCT Filed: Nov. 7, 2016

(86) PCT No.: PCT/CN2016/104806
§ 371 (c)(1),
(2) Date: Jun. 26, 2017

(87) PCT Pub. No.: WO2017/177667
PCT Pub. Date: Oct. 19, 2017

(65) Prior Publication Data
US 2018/0210276 A1    Jul. 26, 2018

(30) Foreign Application Priority Data

Apr. 15, 2016  (CN) .................... 2016 2 0320075 U (51) Int. Cl.
*G02F 1/1335* (2006.01)
*G02F 1/1362* (2006.01)
*H01L 27/12* (2006.01)

(52) U.S. Cl.
CPC .. *G02F 1/133512* (2013.01); *G02F 1/133514* (2013.01); *G02F 1/136204* (2013.01);
(Continued)

(58) Field of Classification Search
CPC ............... G02F 1/1345; G02F 1/13452; G02F 1/13454; G02F 2001/13456;
(Continued)

(56) References Cited

U.S. PATENT DOCUMENTS

2003/0098937 A1   5/2003  Lee et al.
2010/0188592 A1*  7/2010  Tanaka .............. G02F 1/136204
                                                 349/43
(Continued)

FOREIGN PATENT DOCUMENTS

CN    101923235 A    12/2010
CN    103268036 A     8/2013
(Continued)

OTHER PUBLICATIONS

Jan. 26, 2017—(WO) International Search Report and Written Opinion Appn PCT/CN2016/104806 with English Tran.

*Primary Examiner* — Jessica M Merlin
(74) *Attorney, Agent, or Firm* — Banner & Witcoff, Ltd.

(57) ABSTRACT

A liquid crystal display panel, including a first substrate and a second substrate disposed opposite to the first substrate, the first substrate provided with a pixel area and a periphery area at a side facing the second substrate, a metal line provided in the pixel area and the periphery area, a black matrix provided on the second substrate at a side facing the first substrate, wherein the metal line includes a preset portion disposed in the periphery area, and an opening is provided in the black matrix at a position overlapping the preset portion of the metal line. A display device including the liquid crystal display panel is also provided.

20 Claims, 5 Drawing Sheets

(52) U.S. Cl.
CPC .. *G02F 1/136209* (2013.01); *G02F 1/136286* (2013.01); *H01L 27/124* (2013.01); *G02F 2201/121* (2013.01); *G02F 2201/50* (2013.01)

(58) Field of Classification Search
CPC ........... G02F 1/13458; G02F 1/133512; G02F 1/136209; G02F 1/136204; G02F 2001/50; H01L 27/124
See application file for complete search history.

(56) References Cited

U.S. PATENT DOCUMENTS

| | | | | |
|---|---|---|---|---|
| 2012/0200820 | A1* | 8/2012 | Sato | G02F 1/1333 349/153 |
| 2014/0078420 | A1 | 3/2014 | Liu et al. | |
| 2015/0177581 | A1* | 6/2015 | Yabuki | G02F 1/136286 349/42 |
| 2015/0198842 | A1* | 7/2015 | Kwak | H01L 27/1248 349/42 |
| 2015/0332644 | A1* | 11/2015 | Fujikawa | G09G 3/3611 345/100 |
| 2016/0202534 | A1* | 7/2016 | Chen | G02F 1/1368 349/43 |
| 2017/0139263 | A1* | 5/2017 | Jin | G02F 1/133512 |

FOREIGN PATENT DOCUMENTS

| | | | |
|---|---|---|---|
| CN | 103926742 A | * | 7/2014 |
| CN | 205539837 U | | 8/2016 |

* cited by examiner

LIQUID CRYSTAL DISPLAY PANEL AND DISPLAY DEVICE

The application is a U.S. National Phase Entry of International Application No. PCT/CN2016/104806 filed on Nov. 7, 2016, designating the United States of America and claiming priority to Chinese Patent Application No. 201620320075.2 filed on Apr. 15, 2016. The present application claims priority to and the benefit of the above-identified applications and the above-identified applications are incorporated by reference herein in their entirety.

TECHNICAL FIELD

Embodiments of the present disclosure relate to a liquid crystal display panel and a display device.

BACKGROUND

Liquid crystal display has become a prevailing mode of flat panel display. With the liquid crystal display technology widely used in TV set, cell phone and public information display, requirements on display quality of the liquid crystal display panel are gradually increased.

One factor that causes display quality of a liquid crystal display degraded is impurity ions existing in the liquid crystal. Black matrix in the liquid crystal display panel is a main source of the impurity ions. The impurity ions in the black matrix will be aggregated in a region between the black matrix and metal lines under effect of voltages applied on the metal lines in the liquid crystal display panel and permeated to the liquid crystal layer from the region. The impurity ions are main factors for the aging and further the degradation of the liquid crystal material during the operation. The impurity ions will produce adverse effect on the image display under effect of the applied electric field, such as image blur, and degrade display quality of the liquid crystal display panel, thereby deteriorating reliability of the liquid crystal display panel.

SUMMARY

At least one embodiment of the present disclosure provides a liquid crystal display panel, comprising a first substrate and a second substrate disposed opposite to the first substrate, a pixel area and a periphery area are disposed at a side of the first substrate facing the second substrate, the pixel area and the periphery area are provided with a metal line, and a black matrix is provided on the second substrate at a side facing the first substrate, wherein the metal line comprises a preset portion disposed in the periphery area, and an opening is provided in the black matrix at a position overlapping the preset portion of the metal line.

In one embodiment of the present disclosure, the preset portion of the metal line is a widening portion of the metal line.

In one embodiment of the present disclosure, the preset portion of the metal line is an electrode of a capacitor disposed in the periphery area.

In one embodiment of the present disclosure, the electrode of the capacitor is an electrode of a capacitor of a GOA circuit disposed in the periphery area.

In one embodiment of the present disclosure, the preset portion of the metal line is a metal base disposed at an end of the metal line.

In one embodiment of the present disclosure, the metal line is an electrostatic protection line, a preset portion of which is located between extending lines of adjacent scanning lines.

In one embodiment of the present disclosure, an opening is provided in the black matrix at a position overlapping the preset portion of the electrostatic protection line, a width of the opening is less than or equal to a width of the electrostatic protection line.

In one embodiment of the present disclosure, orthographic projection of the opening in the black matrix overlapping the preset portion of the electrostatic protection line on the first substrate falls within orthographic projection of the electrostatic protection line on the first substrate and is located between extending lines of adjacent scanning lines.

In one embodiment of the present disclosure, the metal line is a common electrode lead, a preset portion of which is located between extending lines of adjacent scanning lines.

In one embodiment of the present disclosure, an opening is provided in the black matrix at a position overlapping a preset portion of the common electrode lead, a width of the opening is less than or equal to a width of the common electrode lead.

In one embodiment of the present disclosure, orthographic projection of the opening in the black matrix overlapping the preset portion of the common electrode lead on the first substrate falls within orthographic projection of the common electrode lead on the first substrate and is located between extending lines of adjacent scanning lines.

In one embodiment of the present disclosure, a color filter layer is provided on the second substrate at a position of the opening of the black matrix overlapping the preset portion of the metal line.

In one embodiment of the present disclosure, the color filter layer is a blue filter layer.

In one embodiment of the present disclosure, orthographic projection of the opening in the black matrix overlapping the preset portion of the metal line on the second substrate falls within orthographic projection of the color filter layer on the second substrate.

In one embodiment of the present disclosure, a color filter layer is provided on the first substrate at a position of the preset portion of the metal line.

In one embodiment of the present disclosure, the color filter layer is a blue color filter layer.

In one embodiment of the present disclosure, orthographic projection of the opening in the black matrix overlapping the preset portion of the metal line on the first substrate falls within orthographic projection of the color filter layer on the first substrate.

In one embodiment of the present disclosure, area of the orthographic projection of the opening in the black matrix overlapping the preset portion of the metal line on the first substrate is less than or equal to area of the orthographic projection of the preset portion of the metal line on the first substrate.

In one embodiment of the present disclosure, orthographic projection of the opening in the black matrix overlapping the preset portion of the metal line on the first substrate falls within orthographic projection of the preset portion of the metal line on the first substrate.

At least one embodiment of the present disclosure further provides a display device, comprising the liquid crystal display panel described above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE SIGNS 10, first substrate;
101, first insulating layer;
102, second insulating layer;
103, passivation layer;
104, second color filter layer;
11, pixel region;
111, data line;
112, scanning line;
113, common line;
12, first periphery area;
121, widening portion;
122, metal base;
13, second periphery area;
131, electrostatic protection line;
132, electrostatic protection unit;
14, third periphery area;
141, electrodes of capacitor;
15, fourth periphery area;
151, common electrode lead;
20, second substrate;
21, black matrix;
210, pixel opening;
211, opening overlapping the widening portion;
212, opening overlapping the metal base;
213, opening overlapping the electrostatic protection line
214, opening overlapping the electrodes of capacitor;
215, opening overlapping the common electrode lead;
22, flatten layer;
23, first color filter layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
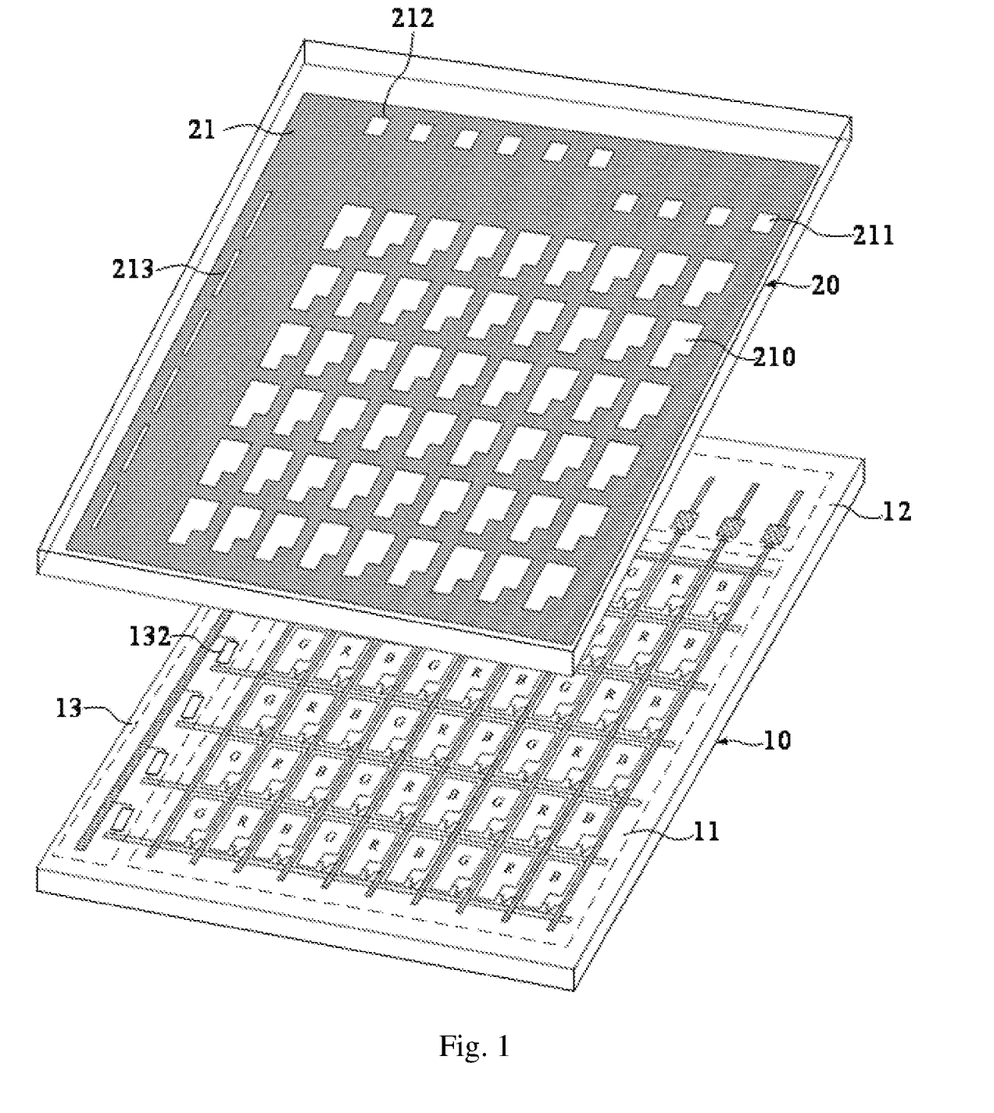
FIG. 1 is an illustrative structural view of an liquid crystal panel according to one embodiment of the present disclosure.
Figure 2:
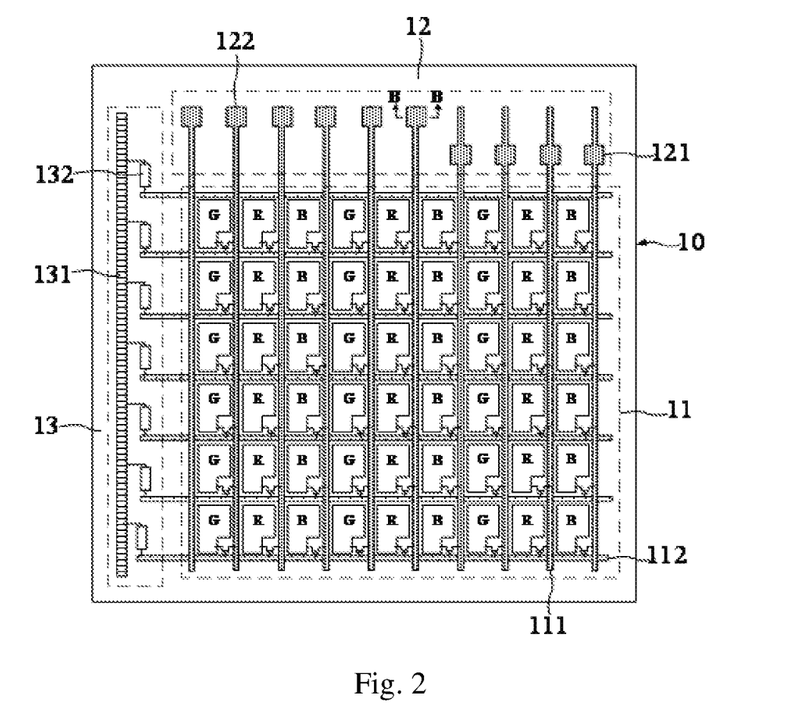
FIG. 2 is an illustrative structural view of the first substrate as illustrated in FIG. 1.
Figure 4:
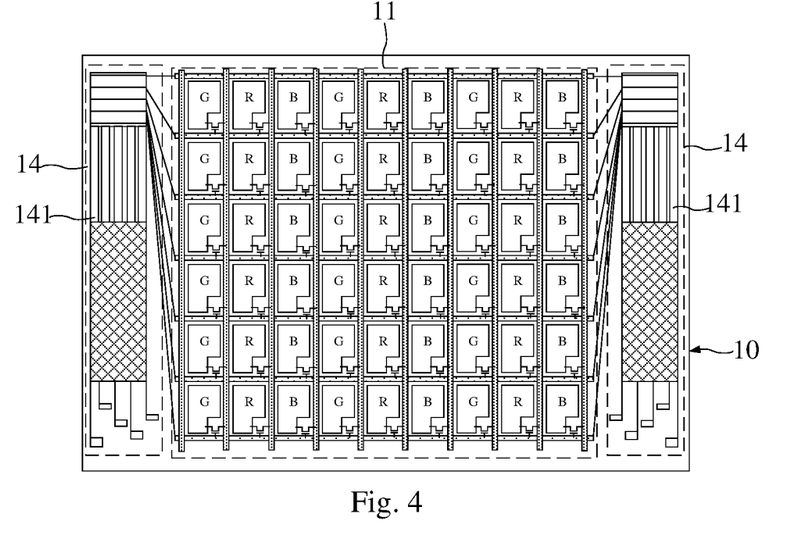
FIG. 4 is an illustrative structural view of the first substrate of an liquid crystal panel according to another embodiment of the present disclosure.
Figure 6:
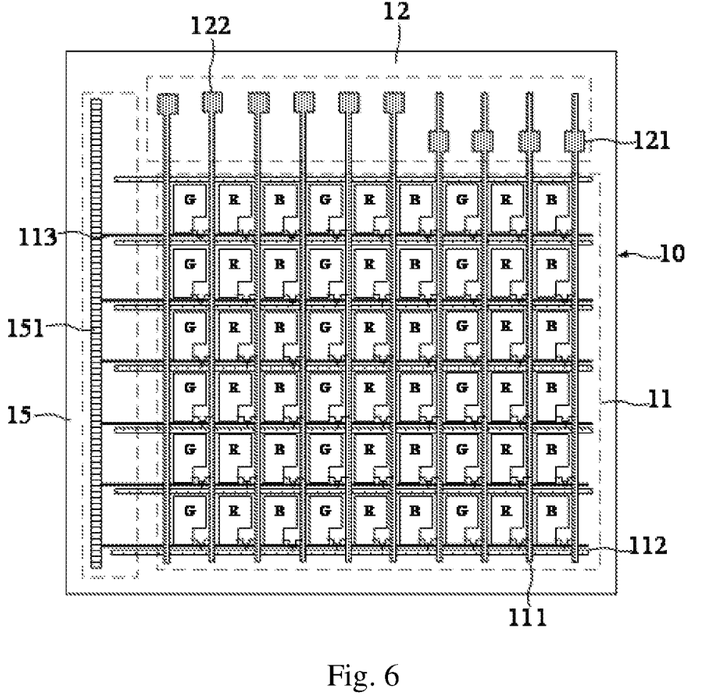
FIG. 6 is an illustrative structural view of the first substrate of an liquid crystal panel according to yet another embodiment of the present disclosure.

As illustrated in FIG. 1, a liquid crystal display panel according to one embodiment of the present disclosure comprises a first substrate 10 and a second substrate disposed opposite to the first substrate 10, wherein:

a pixel area 11 and a periphery area are provided on the first substrate 10 at a side facing the second substrate 20, the pixel area 11 is a display area of the liquid crystal display panel, in which a plurality of pixel units are disposed, the periphery area is a non-display area of the liquid crystal display panel and is disposed around the pixel area 11. For example, the periphery area can be the first periphery area 12 and the second periphery area 13, as illustrated in FIG. 2, the third periphery area 14 as illustrated in FIG. 4, and the fourth periphery area 15 as illustrated in FIG. 6.

A metal line is provided in the pixel area 11 and the periphery area. For example, as illustrated in FIG. 2, the metal line in the pixel area 11 comprises a data line 111 and a scanning line 112, the data line 111 connected to a source of a thin film transistor disposed in the pixel area 11, and the scanning line 112 connected to a gate of the thin film transistor disposed in the pixel area 11. Additionally, as illustrated in FIG. 6, the metal line in the pixel area 11 can further comprise a common line 113, the metal line in the periphery area comprises a portion of the data line 111 in the first periphery area 12, and a portion of the scanning line 112 in the second periphery area 13, and further an electrostatic protection line 131 in the second periphery area 13, as illustrated in FIG. 2; and further a common electrode 151 in the fourth periphery area 15, as illustrated in FIG. 6, and additionally, the metal line further comprises a preset portion disposed in the periphery area.

As illustrated in FIG. 1, a black matrix is provided on the second substrate at a side facing the first substrate, and a pixel opening 210 is provided in the black matrix 21 corresponding to the pixel area 11. Additionally, an opening is provided in the black matrix at a position overlapping the preset portion of the metal line.

A liquid crystal layer is interposed between the first substrate 10 and the second substrate 20.

With different preset portions of the metal line, the opening provided in the black matrix at a position overlapping the preset portion of the metal line can be implemented in various manners.

Implementation Manner I

Please refer to FIG. 2, the preset portion of the metal line is a widening portion 121 of the metal line disposed in the first periphery area 12. And refer to FIG. 3, an opening 211 is provided in the black matrix 21 at a position overlapping the widening portion 121.

Implementation Manner II

Figure 5:
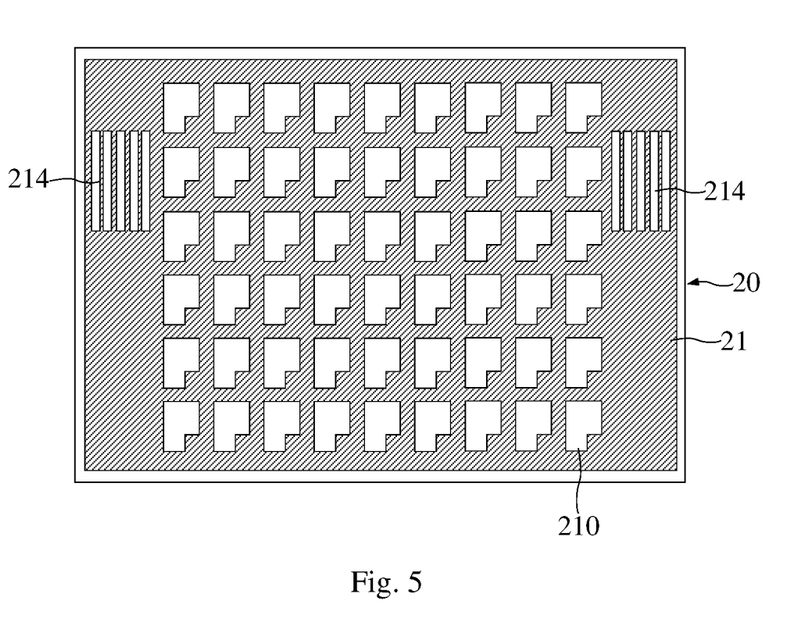
FIG. 5 is an illustrative structural view of the second substrate of an liquid crystal panel according to another embodiment of the present disclosure.

The preset portion of the metal line is an electrode of a capacitor disposed in the periphery area. For example, as illustrated in FIG. 4, the electrode of the capacitor is an electrode 141 of a capacitor in the gate driver circuit on array (GOA). And then, an opening 214 is provided in the black matrix 21 at a position overlapping the electrode 141 of the capacitor, as illustrated in FIG. 5.

Implementation Manner III

Figure 3:
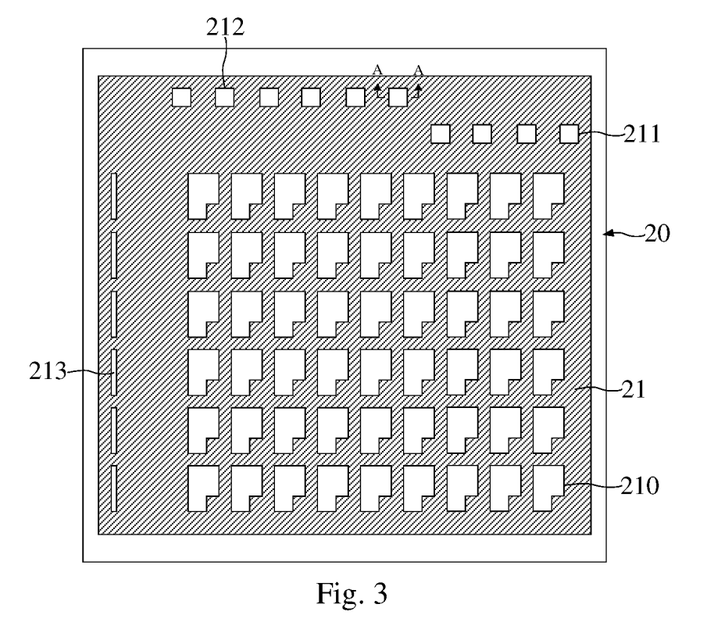
FIG. 3 is an illustrative structural view of the second substrate as illustrated in FIG. 2.

As illustrated in FIG. 2, the present portion of the metal line is a metal base 122 disposed at an end of the metal line, for example, it can be the metal base 122 at an end of the data line 111 disposed in the first periphery area 12 which is illustrated in FIG. 2. Alternatively, as illustrated in FIG. 3, an opening 121 overlapping the metal base 122 is provided in the black matrix at a position overlapping the metal base.

Implementation Manner IV

The metal line is the electrostatic protection line 131, the scanning line 112 is connected with the electrostatic protection line 131 through an electrostatic protection unit 132, and a preset portion of the electrostatic protection line 131 is located between extending lines of adjacent scanning lines 112. As illustrated in FIG. 3, an opening 213 overlapping the electrostatic protection line is provided in the black matrix 21 at a position overlapping the preset portion of the electrostatic protection line 131, a width of the opening 213 is less than or equal to a width of the electrostatic protection line 131. For example, orthographic projection of the opening 213 overlapping the electrostatic protection line 131 on the first substrate 10 falls within orthographic projection of the electrostatic protection line 131 on the first substrate 10, and is located between extending lines of adjacent scanning line 112. For another example, a width direction of the electrostatic protection line 131 is identical with the extending direction of the scanning line 112, and a width direction of the opening 213 of the black matrix 21 overlapping the electrostatic protection line is identical with a width direction of the electrostatic protection line 131. That orthographic projection of the opening 213 overlapping the electrostatic protection line on the first substrate 10 falls within orthographic projection of the electrostatic protection line 131 on the first substrate 10, refers to that orthographic projection of the opening 213 overlapping the electrostatic protection line on the first substrate 10 does not go beyond scope the orthographic projection of the electrostatic protection line 131 on the first substrate 10, and profile of the orthographic projection of the opening 213 overlapping the electrostatic protection line on the first substrate 10 can identical with profile of the orthographic projection of the electrostatic protection line 131 on the first substrate 10. In this implementation manner, the electrostatic protection line 131 can also be a common electrode lead.

Implementation Manner V

If the metal line is the common electrode lead 151 as illustrated in FIG. 6, the preset portion thereof is located between extending lines of adjacent scanning lines 112. As illustrated in FIG. 6, an opening 215 overlapping the common electrode lead is provided in the black matrix 21 at a position overlapping the preset portion of the common electrode lead 151, and a width of the opening is less than or equal to a width of the common electrode lead 151. For example, orthographic projection of the opening 215 overlapping the common electrode lead on the first substrate 10 falls within orthographic projection of the common electrode lead 151 on the first substrate 10, and is located between extending lines of adjacent scanning lines 112. The common electrode lead 151 can also be a storage electrode lead or a storage electrode line. The width direction of the common electrode lead 151 is identical with the extending direction of the scanning line 112, and the width direction of the opening 215 in the black matrix 21 overlapping the common electrode lead is identical with the width direction of the common electrode lead 151. That orthographic projection of the opening 215 overlapping the common electrode lead on the first substrate 10 falls within orthographic projection of the common electrode lead 151 on the first substrate 10, refers to that orthographic projection of the opening 215 overlapping the common electrode lead on the first substrate 10 does not go beyond scope of the orthographic projection of the common electrode lead 151 on the first substrate 10, and profile of the orthographic projection of the opening 215 overlapping the common electrode lead on the first substrate 10 can be identical with profile of the orthographic projection of the common electrode lead 151 on the first substrate 10.

In the liquid crystal display panel according to embodiments of the present disclosure, the black matrix 21 disposed on the second substrate 20 is provided an opening 211 overlapping the widening portion at a position overlapping the widening portion 121 of the metal line on the first substrate 10, an opening 214 overlapping an electrode of a capacitor at a position overlapping the electrode 141 of the capacitor on the first substrate, an opening 212 overlapping the metal base at a position overlapping the metal base on the first substrate 10, an opening 213 overlapping the electrostatic protection line at a position overlapping the electrostatic protection line 131 on the first substrate 10, and an opening 215 overlapping the common electrode lead at a position overlapping the common electrode lead 151 on the first substrate 10;

The opening 211 overlapping the widening portion, the opening 214 overlapping an electrode of a capacitor, the opening 212 overlapping the metal base, the opening 213 overlapping the electrostatic protection line, and the opening 215 overlapping the common electrode lead reduce area of overlapping portion of the black matrix 21 with the metal line at positions where the black matrix overlaps the widening portion 121 of the metal line, the electrode 141 of the capacitor, the metal base 122, the electrostatic protection line 131 and the common electrode lead 151, thereby mitigating the problem that impurity ions in the black matrix aggregate and permeate to the liquid crystal layer under effect of voltages on the metal lines and degrade the display quality of the liquid crystal display panel, and improving stability of the liquid crystal display panel in operation.

In one embodiment of the present disclosure, in order to further enhance the light blocking function of the black matrix 21 and reduce possibility that light leaks at opening of the black matrix 21 overlapping the preset portion of the metal line, a color filter layer configured to block light is provided on the first substrate 10 or the second substrate 20 corresponding to the opening of the black matrix 21 overlapping the preset portion of the metal line, and can be implemented in the following manners.

Implementation Manner I:

The color filter layer configured to block light is provided on the second substrate 20. The second substrate 20 is provided with the color filter layer at a position corresponding to an opening in the black matrix 21 overlapping the preset portion of the metal line.

Figure 8A:
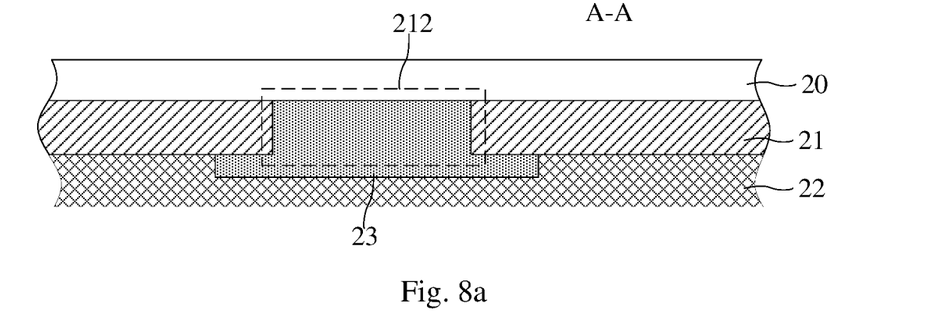
FIG. 8a is a cross sectional view of structure of the second substrate at A-A as illustrated in FIG. 3.

Take the second substrate 20 as an example. A cross sectional view at the opening 212 of the second substrate 20 overlapping the metal base in the FIG. 3 is illustrated in FIG. 8a. The second substrate 20 is provided with a black matrix 21 and a flatten layer 22. The black matrix 21 is provided with an opening 212 overlapping the metal base, and a first color filter layer 23 is filled in the opening 212 overlapping the metal base.

Figure 8B:
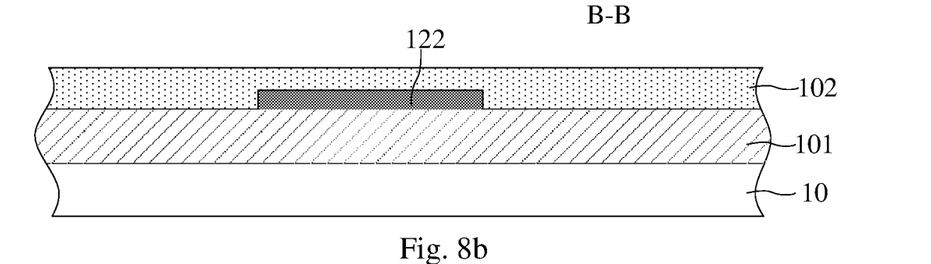
FIG. 8b is a cross sectional view of structure of the first substrate at B-B as illustrated in FIG. 2.

A cross sectional view of the first substrate in the FIG. 2 at the metal base 122 is illustrated in FIG. 8b. The first substrate 10 is provided with a first insulating layer 101 and a second insulating layer 102, and the metal base 122 is disposed on the first insulating layer 101.

In one embodiment of the present disclosure, the first color filter layer 23 is a blue filter layer, thereby enhancing function thereof of blocking light.

And further, area of orthographic projection of the color filter layer on the second substrate 20 is greater than or equal to area of orthographic projection of the opening of the black matrix 21 overlapping the preset portion of the metal line, and orthographic projection of the opening of the black matrix 21 overlapping the preset portion of the metal line on the second substrate 20 falls within orthographic projection of the color filter layer on the second substrate 20. That orthographic projection of the opening of the black matrix 21 overlapping the preset portion of the metal line on the second substrate 20 falls within orthographic projection of the color filter layer on the second substrate 20, refers to that orthographic projection of the opening in the black matrix 21 overlapping the preset portion of the metal line on the second substrate 20 does not go beyond scope of orthographic projection of the color filter layer on the second substrate 20, and profile of the orthographic projection of the opening in the black matrix 21 overlapping the preset portion of the metal line on the second substrate 20 can be identical with profile of the orthographic projection of the color filter layer on the second substrate 20.

Area of the orthographic projection of the first color filter layer 23 on the second substrate is greater than area of the orthographic projection of the opening 212 in the black matrix 21 overlapping the metal base on the second substrate 20. The orthographic projection of the opening 212 in the black matrix 21 overlapping the metal base on the second substrate 20 falls within the orthographic projection of the color filter layer 23 on the second substrate 20.

Implementation Manner II:

The color filter configured to block light is disposed on the first substrate 10, and the color filer layer is disposed on the first substrate 10 at a position overlapping with the preset portion of the metal line.

Take the first substrate 10 illustrated in FIG. 2 as an example. A cross sectional view of the first substrate at the metal base 122 is illustrated in FIG. 9b. the first insulating layer 101 and a second insulating layer 102 are disposed on the first substrate 10, the metal base 122 is disposed on the first insulating layer 101, a second color filter layer 104 is disposed on a position of the second insulating layer corresponding to the metal base 122, and a passivation layer 103 is disposed on the second insulating layer 102 and the second color filter layer 104.

Figure 9A:
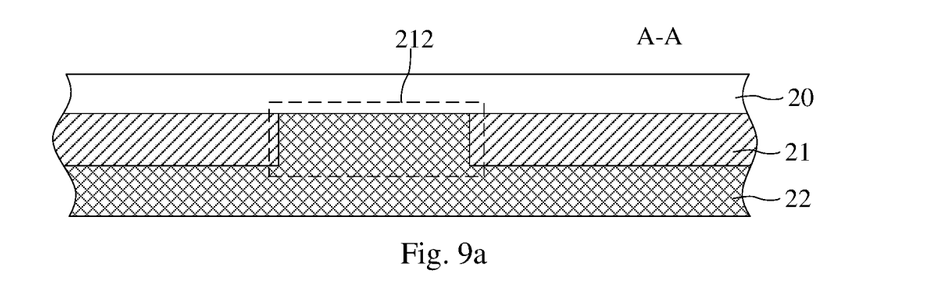
FIG. 9a is a cross sectional view of another structure of the second substrate at A-A as illustrated in FIG. 3.
Figure 9B:
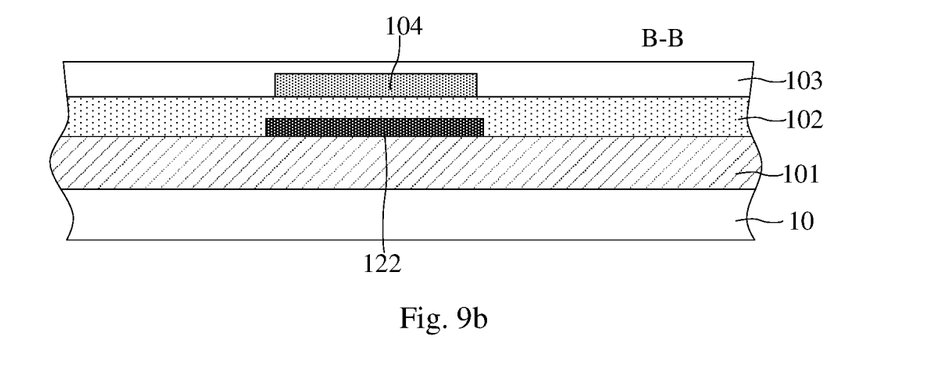
FIG. 9b is a cross sectional view of another structure of the first substrate at B-B as illustrated in FIG. 2.

A cross sectional view of an opening of the second substrate 20 that corresponds to the first substrate as illustrated in FIG. 9b overlapping the metal base as illustrated in FIG. 3 is illustrated in FIG. 9a, a black matrix 21 and a passivation layer 22 are disposed on the second substrate 20, an opening 212 overlapping the metal base is disposed on the black matrix 21, and a portion of the passivation layer 22 is filled in the opening 212 overlapping the metal base.

In one embodiment of the present disclosure, the second color filter layer 104 is a blue filter layer, thereby improving the function thereof of blocking light.

And further, area of orthographic projection of the color filter layer on the first substrate 10 is greater than or equal to area of orthographic projection an opening in the black matrix 21 overlapping the preset portion of the metal line on the first substrate 10, and the orthographic projection of the opening in the black matrix 21 overlapping the preset portion of the metal line on the first substrate 10 falls within the orthographic projection of the color filter layer on the first substrate 10. That the orthographic projection of the opening in the black matrix 21 overlapping the preset portion of the metal line on the first substrate 10 falls within the orthographic projection of the color filter layer on the first substrate 10, refers to that the orthographic projection of the opening in the black matrix 21 overlapping the preset portion of the metal line on the first substrate 10 does not go beyond scope of the orthographic projection of the color filter layer on the first substrate 10, and profile of the orthographic projection of the opening in the black matrix 21 overlapping the preset portion of the metal line on the first substrate 10 can be identical with profile of the orthographic projection of the color filter layer on the first substrate 10.

Area of the orthographic projection of the second color filter layer 104 on the first substrate 10 is greater than area of the orthographic projection of the opening in the black matrix 21 overlapping the metal base on the first substrate 10, and the orthographic projection of the opening in the black matrix 21 overlapping the metal base on the first substrate 10 falls within the orthographic projection of the second color filter layer 104 on the first substrate 10.

Figure 7:
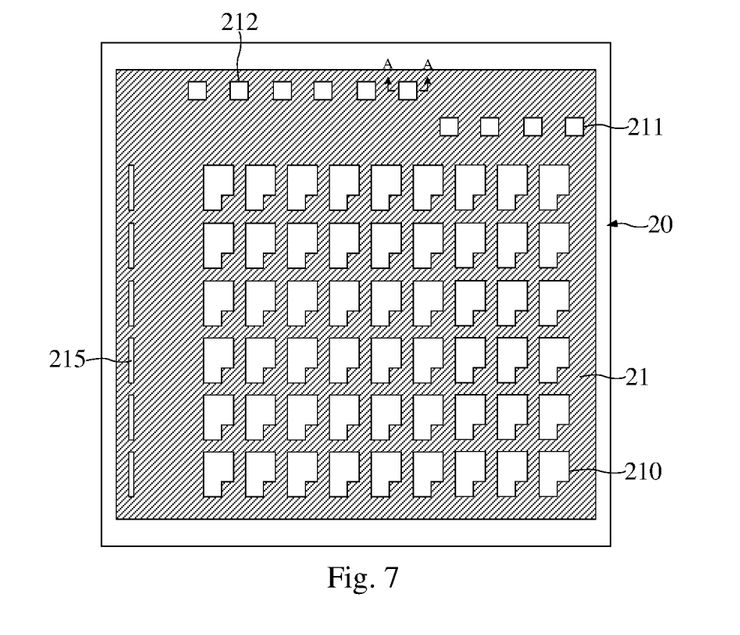
FIG. 7 is an illustrative structural view of the second substrate of an liquid crystal panel according to yet another embodiment of the present disclosure.

In one embodiment of the present disclosure, in order to enhance the light blocking function of the black matrix 21 and reduce possibility of light leakage, please refer to FIG. 3, FIG. 5 and FIG. 7, area of the orthographic projection of the opening in the black matrix 21 overlapping the preset portion of the metal line on the first substrate 10 is less than or equal to area of the orthographic projection of the preset portion of the metal line on the first substrate 10.

For example, area of the orthographic projection of the opening 211 overlapping the widening portion on the first substrate 10 is less than or equal to area of the orthographic projection of the widening portion 121 of the metal line on the first substrate 10;

area of the orthographic projection of the opening 214 overlapping the electrode of the capacitor on the first substrate is less than or equal to area of the orthographic projection of the electrode 141 of the capacitor on the first substrate 10;

area of the orthographic projection of the opening 212 overlapping the metal base on the first substrate 10 is less than or equal to area of the orthographic projection of the metal base 122 at the end of the metal line on the first substrate 10;

for example, the orthographic projection of the opening in the black matrix 21 overlapping the preset portion of the metal line on the first substrate 10 falls within the orthographic projection of the preset portion of the metal line on the first substrate 10.

That the orthographic projection of the opening in the black matrix 21 overlapping the preset portion of the metal line on the first substrate 10 falls within the orthographic projection of the preset portion of the metal line on the first substrate 10, refers to that the orthographic projection of the opening in the black matrix overlapping the preset portion of the metal line on the first substrate 10 does not go beyond scope of the orthographic projection of the preset portion of the metal line on the first substrate, profile of the orthographic projection of the opening in the black matrix 21 overlapping the preset portion of the metal line on the first substrate 10 can be identical with profile of the orthographic projection of the present portion of the metal line on the first substrate 10.

For example, the orthographic projection of the opening 211 overlapping the widening portion falls within the orthographic projection of the widening portion 121 of the metal line on the first substrate 10;

the orthographic projection of the opening 214 overlapping the electrode of the capacitor on the first substrate 10 falls within the orthographic projection of the electrode 141 of the capacitor on the first substrate 10;

the orthographic projection of the opening 212 overlapping the metal base on the first substrate 10 falls within the orthographic projection of the metal base 122 at the end of the metal line on the first substrate 10.

At least one embodiment of the present disclosure further provides a display device, comprising the liquid crystal display panel mentioned above.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201620320075.2 filed on Apr. 15, 2016, the disclosure of which is hereby entirely incorporated by reference as a part of the present disclosure.

The invention claimed is:

1. A liquid crystal display panel, comprising a first substrate and a second substrate disposed opposite to the first substrate, wherein the first substrate is provided with a pixel area and a periphery area at a side facing the second substrate,
a plurality of metal lines are provided in the pixel area and the periphery area, a black matrix is provided on the second substrate at a side facing the first substrate, each of the plurality of metal lines comprises a preset portion disposed in the periphery area, a plurality of openings spaced apart from each other are provided in the black matrix at positions overlapping preset portions of the metal lines in one-to-one correspondence, and an orthogonal projection of each of the plurality of openings on the second substrate has a closed profile.

2. The liquid crystal display panel according to claim 1, wherein the preset portion of the metal line is a widening portion of the metal line.

3. The liquid crystal display panel according to claim 1, wherein the preset portion of the metal line is an electrode of a capacitor located in the periphery area.

4. The liquid crystal display panel according to claim 3, wherein the electrode of the capacitor is an electrode of a capacitor in a gate driver circuit on array.

5. The liquid crystal display panel according to claim 1, wherein the preset portion of the metal line is a metal base located at an end of the metal line.

6. The liquid crystal display panel according to claim 1, wherein the metal line is an electrostatic protection line, a preset portion of which is located between extending lines of adjacent scanning lines.

7. The liquid crystal display panel according to claim 6, wherein an opening is provided in the black matrix at a position overlapping the preset portion of the electrostatic protection line, a width of the opening is less than or equal to a width of the electrostatic protection line.

8. The liquid crystal display panel according to claim 7, wherein orthographic projection of the opening in the black matrix overlapping the preset portion of the electrostatic protection line on the first substrate falls within orthographic projection of the electrostatic protection line on the first substrate, and is located between extending lines of adjacent scanning lines.

9. The liquid crystal display panel according to claim 1, wherein the metal line is a common electrode lead, a preset portion of the common electrode lead is located between extending lines of adjacent scanning lines.

10. The liquid crystal display panel according to claim 9, wherein an opening is provided in the black matrix at a position overlapping the preset portion of the common electrode lead, a width of the opening is less than or equal to a width of the common electrode lead.

11. The liquid crystal display panel according to claim 10, wherein orthographic projection of the opening in the black matrix overlapping the preset portion of the common electrode lead on the first substrate falls within orthographic projection of the common electrode lead on the first substrate, and is located between extending lines of adjacent scanning lines.

12. The liquid crystal display panel according to claim 1, wherein a color filter layer is provided on the second substrate at a position of the opening of the black matrix overlapping the preset portion of the metal line.

13. The liquid crystal display panel according to claim 12, wherein the color filter layer is a blue filter layer.

14. The liquid crystal display panel according to claim 12, wherein orthographic projection of the opening in the black matrix overlapping the preset portion of the metal line on the second substrate falls within orthographic projection of the color filter layer on the second substrate.

15. The liquid crystal display panel according to claim 1, wherein a color filter layer is provided on the first substrate at a position overlapping the preset portion of the metal line.

16. The liquid crystal display panel according to claim 15, wherein the color filter layer is a blue filter layer.

17. The liquid crystal display panel according to claim 15, wherein orthographic projection of the opening in the black matrix overlapping the preset portion of the metal line on the first substrate falls within orthographic projection of the color filter layer on the first substrate.

18. The liquid crystal display panel according to claim 2, wherein are of orthographic projection of the opening in the black matrix overlapping the preset portion of the metal line on the first substrate is less than or equal to area of orthographic projection of the preset portion of the metal line on the first substrate.

19. The liquid crystal display panel according to claim 18, wherein the orthographic projection of the opening in the black matrix overlapping the preset portion of the metal line on the first substrate falls within the orthographic projection of the preset portion of the metal line on the first substrate.

20. A display device comprising the liquid crystal display panel according to claim 1.

* * * * *